US010689758B2

(12) United States Patent
Yoshida et al.

(10) Patent No.: US 10,689,758 B2
(45) Date of Patent: *Jun. 23, 2020

(54) SUBSTRATE PROCESSING APPARATUS, AND METHOD FOR MANUFACTURING SEMICONDUCTOR DEVICE

(71) Applicant: HITACHI KOKUSAI ELECTRIC INC., Tokyo (JP)

(72) Inventors: Hidenari Yoshida, Toyama (JP); Tomoshi Taniyama, Toyama (JP); Takayuki Nakada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 48 days.

This patent is subject to a terminal disclaimer.

(21) Appl. No.: 15/910,888

(22) Filed: Mar. 2, 2018

(65) Prior Publication Data
US 2018/0187307 A1 Jul. 5, 2018

Related U.S. Application Data

(63) Continuation of application No. PCT/JP2015/075172, filed on Sep. 4, 2015.

(51) Int. Cl.
C23C 16/40 (2006.01)
C23C 16/455 (2006.01)
C23C 16/34 (2006.01)

(52) U.S. Cl.
CPC ...... C23C 16/45578 (2013.01); C23C 16/345 (2013.01); C23C 16/45546 (2013.01); C23C 16/45574 (2013.01)

(58) Field of Classification Search
CPC ............ C23C 16/45578; C23C 16/345; C23C 16/45574; C23C 16/45546; H01L 21/02; H01L 21/67017; H01L 21/67098
USPC ...................................... 118/715; 156/345.33
See application file for complete search history.

(56) References Cited

U.S. PATENT DOCUMENTS

2007/0234961 A1 10/2007 Takahashi et al.
2017/0037512 A1* 2/2017 Saido .................. C23C 16/4408

FOREIGN PATENT DOCUMENTS

| JP | 05-109626 A | 4/1993 |
| JP | 08-139029 A | 5/1996 |
| JP | 09-148315 A | 6/1997 |
| JP | 09-213640 A | 8/1997 |
| JP | 2001-196364 A | 7/2001 |
| JP | 2003-197545 A | 7/2003 |

(Continued)

OTHER PUBLICATIONS

Korean Office Action dated Jul. 29, 2019 for the Korean Patent Application No. 10-2018-7003246.

(Continued)

Primary Examiner — Rudy Zervigon
(74) Attorney, Agent, or Firm — Volpe and Koenig, P.C.

(57) ABSTRACT

Provided is a technique capable of purging a adiabatic region without adversely affecting a processing region. A process chamber including a processing region for processing a substrate and a adiabatic region located below the processing region is included inside. A first exhaust portion for discharging an atmosphere of the processing region, and a second exhaust portion for discharging an atmosphere of the adiabatic region, formed at a position overlapping with the adiabatic region in a height direction, are included.

14 Claims, 9 Drawing Sheets

(56) References Cited

FOREIGN PATENT DOCUMENTS

| | | | |
|---|---|---|---|
| JP | 2007-299776 | A | 11/2007 |
| JP | 2008-041915 | A | 2/2008 |
| JP | 2008-258207 | A | 10/2008 |
| JP | 2010-080657 | A | 4/2010 |
| JP | 2011-066214 | A | 3/2011 |

OTHER PUBLICATIONS

International Search Report in corresponding PCT Application No. PCT/JP2015/075172, dated May 9, 2017.

* cited by examiner

SUBSTRATE PROCESSING APPARATUS, AND METHOD FOR MANUFACTURING SEMICONDUCTOR DEVICE

BACKGROUND

Technical Field

The present teachings relate to a substrate processing apparatus, and a method for manufacturing a semiconductor device.

Related Art

For example, a vertical substrate processing apparatus is used in thermal processing of a substrate in a process of manufacturing a semiconductor device (device). In the vertical substrate processing apparatus, a predetermined number of substrates are arranged in a vertical direction and held by a substrate holder, the substrate holder is put in a process chamber, a process gas is introduced into the process chamber while the substrate is heated by a side heater disposed outside the process chamber, and thin film forming processing or the like is performed on the substrate.

SUMMARY

In the vertical substrate processing apparatus as described above, a purge gas for purging a adiabatic region flows into a processing region where a substrate is processed, a process gas is diluted, and uniformity of film formation may be adversely affected.

the present disclosure is to provide a technique capable of purging a adiabatic region without adversely affecting a processing region.

An aspect of the present disclosure provides a technique including: a process chamber containing a processing region where a substrate is processed and a adiabatic region located below the processing region; a first exhaust portion for discharging an atmosphere of the processing region; and a second exhaust portion for discharging an atmosphere of the adiabatic region, formed at a position overlapping with the adiabatic region in a height direction.

The present disclosure provides a technique capable of purging a adiabatic region without adversely affecting a processing region.

DESCRIPTION OF PREFERRED EMBODIMENTS

Hereinafter, an embodiment will be described with reference to FIG. 1.

Figure 1:
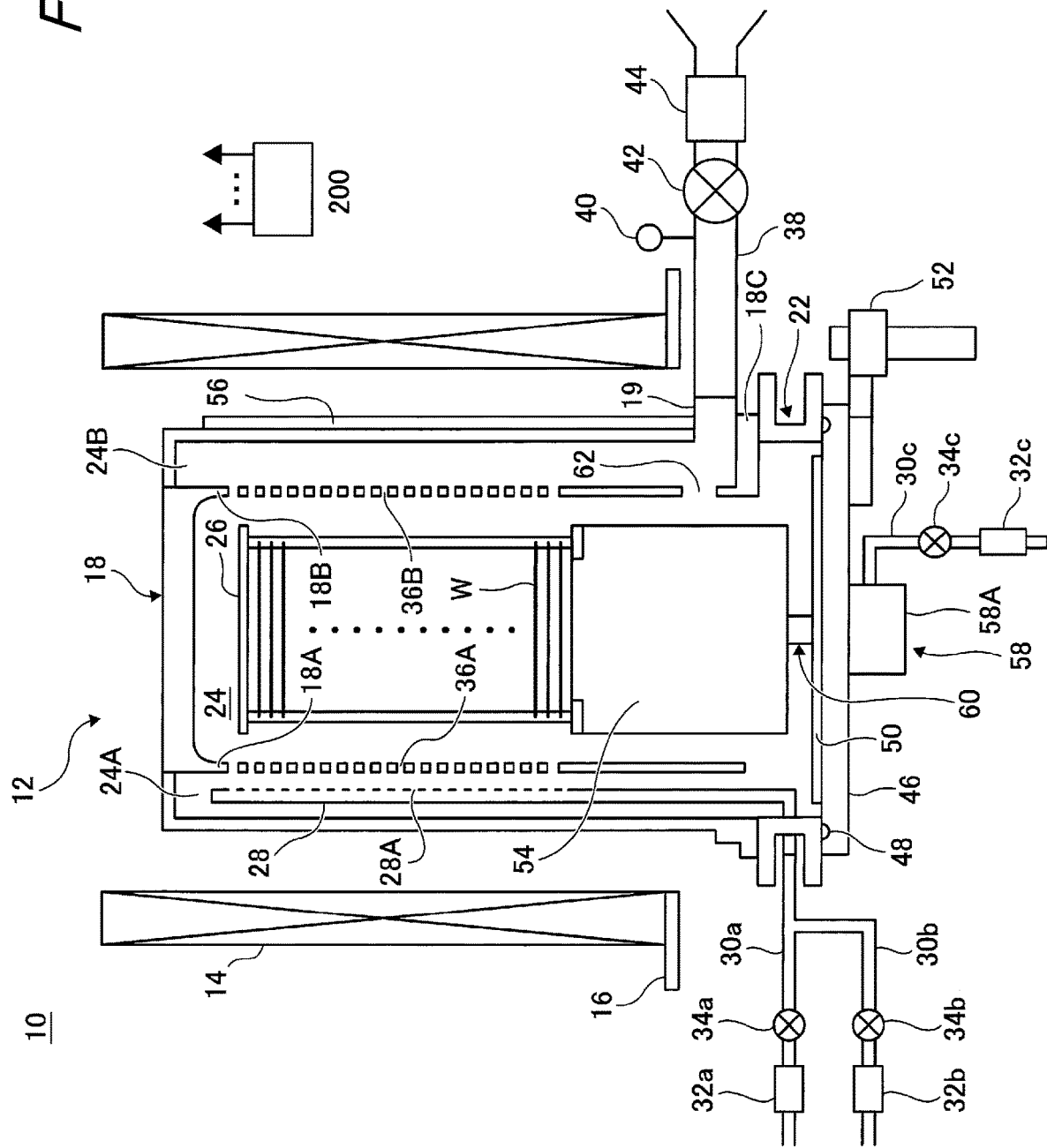
FIG. 1 is a schematic configuration diagram of a vertical processing furnace of a substrate processing apparatus suitably used in embodiments with a processing furnace portion shown in a vertical cross-sectional view.

As illustrated in FIG. 1, in the present embodiment, a substrate processing apparatus is configured as a vertical thermal processing apparatus (batch type vertical thermal processing apparatus) 10 for performing a thermal processing step in an IC manufacturing method.

A processing furnace 12 includes a heater 14 which is a heater unit (hereinafter, referred to as a heater) as a first heating means (heating mechanism). The heater 14 has a cylindrical shape, is supported by a heater base 16 as a holding plate, and is thereby vertically disposed. The heater 14 also functions as an activation mechanism (excitation unit) for activating (exciting) a gas with heat as described later.

A reaction tube 18 constituting a reaction container (processing container) is disposed inside the heater 14. The reaction tube 18 is made of a heat-resistant material such as quartz ($SiO_2$) or silicon carbide (SiC), and is formed in a cylindrical shape having an upper end closed and a lower end open. The reaction tube 18 is disposed concentrically with the heater 14. A gas supply space 24A as a supply buffer chamber and a gas exhaust space 24B as an exhaust buffer chamber are disposed on an outer wall of the reaction tube 18 so as to face each other, and are formed so as to protrude out of the reaction tube 18. The gas supply space 24A is configured by the outer wall of the reaction tube 18 and a partition portion 18A. The gas exhaust space 24B is configured by the outer wall of the reaction tube 18 and a partition portion 18B. The partition portion 18A and the partition portion 18B are configured as a part of a side wall (inner wall) of the reaction tube 18. At a lower end of the partition portion 18B, a flange portion 18C protruding toward an outer peripheral side is formed. A lower end of the reaction tube 18 is supported by a metal manifold 22.

A process chamber 24 is formed in a cylinder hollow portion of the reaction tube 18. The process chamber 24 is configured to be able to house wafers W as a substrate while the wafers W are aligned in a horizontal posture in multiple stages in a vertical direction by a boat 26 described later. The process chamber 24 includes a processing region A and a adiabatic region B described later.

In the gas supply space 24A, a nozzle 28 is disposed. The nozzle 28 is made of a heat-resistant material such as quartz or SiC. A gas supply pipe 30a is connected to the nozzle 28. In the gas supply pipe 30a, a mass flow controller (MFC) 32a which is a flow rate controller (flow rate control unit) and a valve 34a which is an on-off valve are disposed in order from an upstream side. A gas supply pipe 30*b* for supplying an inert gas is connected to the gas supply pipe 30*a* at a downstream side of the valve 34*a*. In the gas supply pipe 30*b*, an MFC 32*b* and a valve 34*b* are disposed in order from an upstream side. A process gas supply portion as a process gas supply system is configured mainly by the gas supply pipe 30*a*, the MFC 32*a*, and the valve 34*a*. An inert gas supply portion as an inert gas supply system is configured by the gas supply pipe 30*b*, the MFC 32*b*, and the valve 34*b*. The gas supply pipe 30*b*, the MFC 32*b*, and the valve 34*b* may be included in the process gas supply portion (process gas supply system).

The nozzle 28 is disposed in the gas supply space 24A so as to rise upward in an arrangement direction of the wafers W along an upper portion of the reaction tube 18 from a lower portion thereof. That is, the nozzle 28 is disposed along a wafer arrangement region where the wafers W are arranged in a region horizontally surrounding the wafer arrangement region on a lateral side of the wafer arrangement region. The nozzle 28 is configured as an L-shaped long nozzle, and a horizontal portion thereof is disposed so as to pass through a side wall of the manifold 22. A vertical portion thereof is disposed so as to rise from at least one end side of the wafer arrangement region toward the other end side. A gas supply hole 28A for supplying a gas is formed on a side surface of the nozzle 28. Each of the gas supply holes 28A is open so as to face a center of the reaction tube 18, and can supply a gas toward the wafers W. A plurality of the gas supply holes 28A is disposed in a region (wafer W placement region of the boat 26, hereinafter, referred to as the processing region A) where a substrate is processed from a lower portion of the reaction tube 18 to an upper portion thereof. The gas supply holes 28A have the same opening area as each other, and are disposed at the same opening pitch.

A plurality of horizontally elongated slit-shaped gas supply slits 36A is disposed in the partition portion 18A so as to correspond to the gas supply holes 28A from a lower portion of the processing region A of the partition portion 18A to an upper portion thereof.

Figure 6:
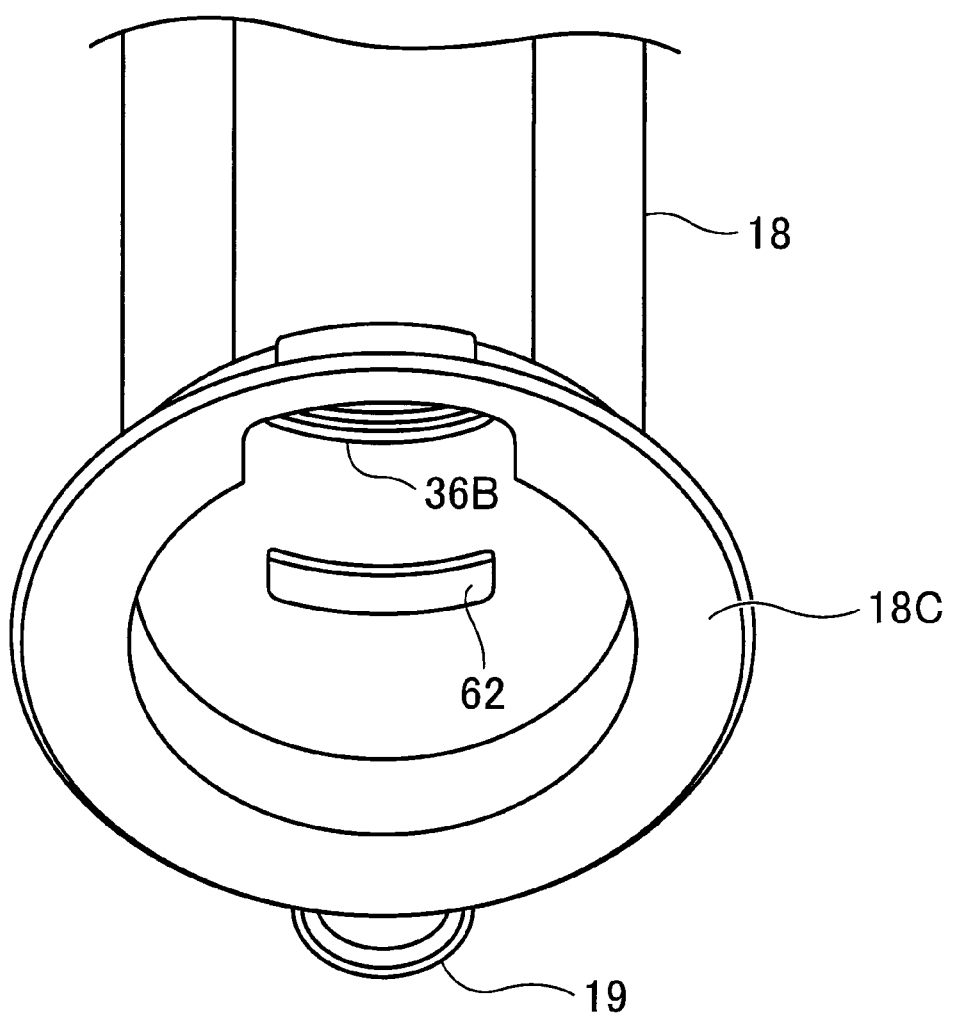
FIG. 6 is a perspective view of an exhaust portion (exhaust port) of a vertical processing furnace of a substrate processing apparatus suitably used in an embodiment.

As illustrated in FIG. 6, a plurality of horizontally elongated slit-shaped gas exhaust slits 36B as first exhaust portions (first exhaust ports) is disposed in the partition portion 18B from a lower portion of the processing region A of the partition portion 18B to an upper portion thereof. The gas exhaust slits 36B are configured by a plurality of rows of openings having substantially the same width as the gas exhaust space 24B, and are disposed at positions overlapping with the processing region A in a height direction. The gas exhaust slits 36B are disposed at positions corresponding to the gas supply slits 36A (positions opposed to the processing region A, that is, positions facing the processing region A). The gas exhaust slit 36B is formed so as to cause the process chamber 24 to communicate with the gas exhaust space 24B, and discharges an atmosphere of the processing region A in the process chamber 24.

An exhaust port 62 as a second exhaust portion (second exhaust port) is formed below the gas exhaust slit 36B of the partition portion 18B. The exhaust port 62 is formed at a position overlapping with a region below the processing region A (a region including a heat insulating portion 54, hereinafter, referred to as a adiabatic region B) in a height direction. In other words, the exhaust port 62 is formed at a position corresponding to the adiabatic region B, that is, at a position facing the adiabatic region B. That is, it can be said that the exhaust port 62 is formed at a position opposed to the adiabatic region B. The exhaust port 62 is formed in a rectangular shape. The opening area thereof is larger than the opening area of one of the gas exhaust slits 36B and smaller than the total opening area of the gas exhaust slits 36B. The width of a rectangular long side of the exhaust port 62 is formed to be equal to or less than the width of the gas exhaust space 24B. With such a constitution, it is possible to suppress discharge of a purge gas from the gas exhaust slit 36B particularly at a boundary portion between the processing region A and the adiabatic region B, and it is possible to suppress deterioration of film formation uniformity due to arrival of the purge gas at the processing region A which is a film formation region. The exhaust port 62 is formed so as to cause the process chamber 24 to communicate with the gas exhaust space 24B, and discharges an atmosphere of the adiabatic region B in the process chamber 24. That is, by disposing the exhaust port 62 in the adiabatic region B, diffusion of a purge gas which has flowed through a periphery of the heat insulating portion 54 into the processing region A is suppressed, and deterioration of film formation uniformity due to dilution of a process gas in the processing region A is suppressed.

An exhaust port 19 communicating with the gas exhaust space 24B is disposed at a lower end of the reaction tube 18. An exhaust pipe 38 for discharging an atmosphere in the process chamber 24 is connected to the exhaust port 19. A vacuum pump 44 as a vacuum-exhaust device is connected to the exhaust pipe 38 through a pressure sensor 40 as a pressure detector (pressure detecting unit) for detecting a pressure in the process chamber 24 and an auto pressure controller (APC) valve 42 as a pressure regulator (pressure regulating unit). By opening and closing a valve while the vacuum pump 44 is operated, the APC valve 42 can perform vacuum-exhaust and can stop vacuum-exhaust in the process chamber 24. Furthermore, by adjusting the degree of valve opening based on pressure information detected by the pressure sensor 40 while the vacuum pump 44 is operated, the APC valve 42 can regulate a pressure in the process chamber 24. An exhaust system is mainly configured by the exhaust pipe 38, the APC valve 42, and the pressure sensor 40. The vacuum pump 44 may be included in the exhaust system.

The exhaust port 62 is preferably formed at a position overlapping with the heat insulating portion 54 in a height direction. In addition, the exhaust port 62 is preferably formed at a position at which at least a part of an opening region of the exhaust port 62 overlaps with an opening region of the exhaust port 19 (exhaust pipe 38) in a horizontal direction. With such a configuration, a purge gas can be discharged more efficiently. In addition, it is possible to smoothly discharge a process gas and a purge gas without causing stagnation or retention of the process gas or the purge gas in the gas exhaust space 24B.

A seal cap 46 is disposed below the manifold 22 as a furnace port lid body capable of airtightly closing a lower end opening of the manifold 22. The seal cap 46 is made of a metal such as stainless steel or a Ni alloy, for example, and is formed in a disc shape. An O-ring 48 as a seal member in contact with a lower end of the manifold 22 is disposed on an upper surface of the seal cap 46. A seal cap plate 50 for protecting the seal cap 46 is disposed in an inner region of the O-ring 48 on the upper surface of the seal cap 46. The seal cap plate 50 is made of a heat-resistant material such as quartz or SiC, for example, and is formed in a disc shape.

The seal cap 46 is configured to be in contact with a lower end of the manifold 22 from a lower side in a vertical direction, and is configured to be raised and lowered in the vertical direction by a boat elevator 52 as a raising/lowering mechanism disposed vertically outside the reaction tube 18. That is, the boat elevator 52 is configured such that the boat 26 can be loaded into and unloaded from the process chamber 24 by raising and lowering the seal cap 46. In other words, the boat elevator 52 is configured as a conveying device (conveying mechanism) for conveying the boat 26, that is, the wafers W into and out of the process chamber 24.

The boat 26 as a substrate holder is configured to support the plurality of wafers W, for example, 25 to 200 wafers W while the wafers W are aligned in a horizontal posture in a vertical direction with centers thereof aligned in multiple stages, that is, so as to cause the wafers W to be arranged at intervals. The boat 26 is made of a heat-resistant material such as quartz or SiC, for example.

The heat insulating portion 54 is disposed in a lower portion of the boat 26. The heat insulating portion 54 is a quartz cap, for example, formed in a cylindrical shape. The heat insulating portion 54 is not limited to the quartz cap, but may be a plurality of disc-shaped heat insulating plates supported in multiple stages in a horizontal posture.

A temperature detecting unit 56 as a temperature detector is disposed along an outer wall of the reaction tube 18. By adjusting the degree of energization to the heater 14 based on temperature information detected by the temperature detecting unit 56, a temperature in the process chamber 24 has a desired temperature distribution.

A rotary shaft 60 for rotating the boat 26 is fixed to a lower portion of the heat insulating portion 54. A rotation mechanism 58 for rotating the boat 26 is disposed in a lower portion of the rotary shaft 60 on a side of the seal cap 46 opposite to the process chamber 24.

The rotation mechanism 58 includes a housing 58A formed in a substantially cylindrical shape with an upper end open and a lower end closed. A gas supply pipe 30c is connected to the housing 58A. In the gas supply pipe 30c, an MFC 32c and a valve 34c are disposed in order from an upstream side. A purge gas supply portion as a purge gas supply system for supplying a purge gas to the adiabatic region B is configured mainly by the gas supply pipe 30c, the MFC 32c, and the valve 34c. The purge gas supply portion is configured so as to supply a purge gas upward from a lower portion of the adiabatic region B. A purge gas is supplied from the gas supply pipe 30c into the housing 58A, upward from a lower portion of the adiabatic region B through a periphery of the rotary shaft 60.

Figure 2:
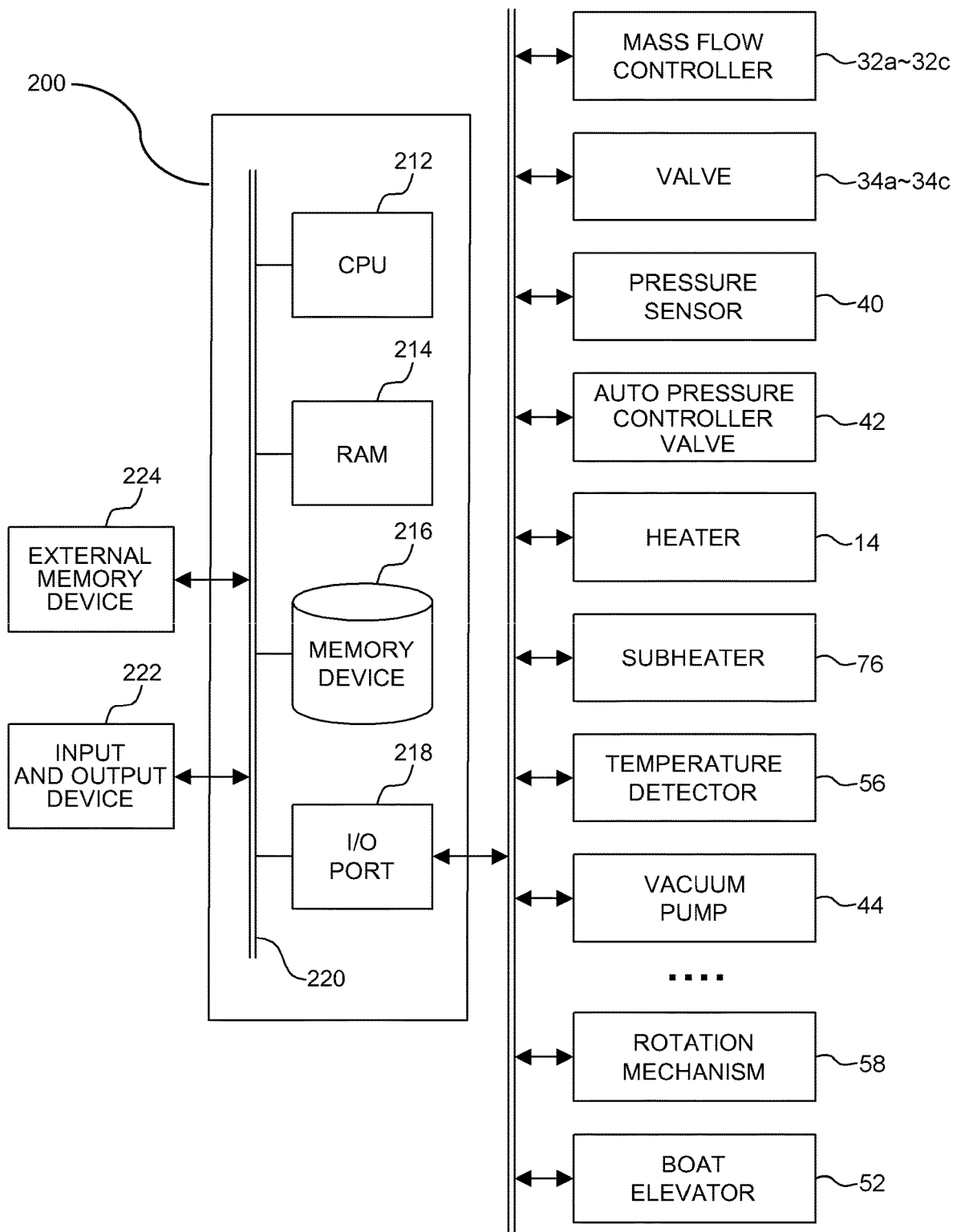
FIG. 2 is a block diagram for explaining a configuration of a control unit of a substrate processing apparatus suitably used in embodiments.

As illustrated in FIG. 2, a controller 200 which is a control unit (control means) is configured as a computer including a central processing unit (CPU) 212, a random access memory (RAM) 214, a memory device 216, and an I/O port 218. The RAM 214, the memory device 216, and the I/O port 218 are configured to be able to exchange data with the CPU 212 through an internal bus 220. An input/output device 222 configured, for example, as a touch panel is connected to the controller 200.

The memory device 216 is configured, for example, by a flash memory and a hard disk drive (HDD). In the memory device 216, a control program for controlling an operation of a substrate processing apparatus, a process recipe in which procedures, conditions, and the like of substrate processing described later are written, and the like are readably stored. The process recipes are combined to each other such that a predetermined result can be obtained by causing the controller 200 to execute each procedure in the substrate processing step described later, and functions as a program. Hereinafter, the process recipe, the control program, and the like are also collectively referred to simply as a program. Here, the term "program" may include only the process recipe itself, may include only the control program itself, or may include both of these. The RAM 214 is configured as a memory area (work area) in which a program, data, or the like read by the CPU 212 is temporarily stored.

The I/O port 218 is connected to the above-described MFCs 32a, 32b, and 32c, valves 34a, 34b, and 34c, pressure sensor 40, APC valve 42, vacuum pump 44, heater 14, temperature detecting unit 56, rotation mechanism 58, boat elevator 52, and the like.

The CPU 212 is configured to read a control program from the memory device 216 and execute the program, and to read a process recipe from the memory device 216 in accordance with input or the like of an operation command from the input/output device 222. The CPU 212 is configured to, according to the content of the process recipe thus read, control operations of adjusting flow rates of various gases by the MFCs 32a, 32b, and 32c, an operation of opening/closing the valves 34a, 34b, and 34c, an operation of opening/closing the APC valve 42, a pressure adjusting operation by the APC valve 42 based on the pressure sensor 40, an operation of starting/stopping the vacuum pump 44, an operation of adjusting a temperature of the heater 14 based on the temperature detecting unit 56, operations of rotating the boat 26 and adjusting a rotational speed of the boat 26 by the rotation mechanism 58, an operation of raising/lowering the boat 26 by the boat elevator 52, and the like.

The controller 200 can be configured by installing the above-described program stored in an external memory device (for example, a magnetic tape, a magnetic disk such as a flexible disk or a hard disk, an optical disk such as CD or DVD, a magneto-optical disk such as MO, or a semiconductor memory such as a USB memory or a memory card) 224 in a computer. The memory device 216 or the external memory device 224 is configured as a computer-readable recording medium. Hereinafter, these are also collectively and simply referred to as a recording medium. Here, the term "recording medium" may include only the memory device 216 itself, may include only the external memory device 224 itself, or may include both of these. Incidentally, provision of a program to a computer may be performed using a communication means such as the Internet or a dedicated line without using the external memory device 224.

Next, a sequence example of processing for forming a film on a substrate (hereinafter, also referred to as film formation processing) will be described as one step of a process for manufacturing a semiconductor device (device) using the above-described substrate processing apparatus 10. Here, an example in which a film is formed on each of the wafers W as a substrate by alternately supplying a first process gas (source gas) and a second process gas (reaction gas) to each of the wafers W will be described.

Hereinafter, an example in which a silicon nitride film ($Si_3N_4$ film, hereinafter also referred to as an SiN film) is formed on each of the wafers W using a hexachlorodisilane ($Si_2Cl_6$, abbreviation: HCDS) gas as a source gas and using an ammonia ($NH_3$) gas as a reaction gas will be described. Incidentally, in the following description, an operation of each part constituting the substrate processing apparatus 10 is controlled by the controller 200.

In film formation processing in the present embodiment, an SiN film is formed on each of the wafers W by performing a predetermined number of times (one or more times) of cycles of non-simultaneously performing a step of supplying an HCDS gas to the wafers W in the process chamber 24, a step of removing the HCDS gas (residual gas) from the interior of the process chamber 24, a step of supplying an NH₃ gas to the wafers W in the process chamber 24, and a step of removing the NH₃ gas (residual gas) from the interior of the process chamber 24.

Here, this film formation sequence is sometimes described as follows for convenience. Note that a similar notation is used in the description of the following modified examples and other embodiments.

Here, the term "wafer" may mean "a wafer itself" or "a stacked body (assembly) of a wafer and a predetermined layer, film, or the like formed on a surface of the wafer". That is, a wafer may mean a wafer including a predetermined layer, film, or the like formed on a surface of the wafer. Here, the term "surface of a wafer" may mean "a surface (exposed surface) of a wafer itself" or "a surface of a predetermined layer, film, or the like formed on the wafer, that is, an outermost surface of the wafer as a stacked body".

Therefore, here, the phrase "a predetermined gas is supplied to a wafer" may mean that "a predetermined gas is supplied to a surface (exposed surface) of a wafer itself", or may mean "a predetermined gas is supplied to a layer, a film, or the like formed on a wafer, that is, to an outermost surface of the wafer as a stacked body". In addition, here, the phrase "a predetermined layer (or film) is formed on a wafer" may mean that "a predetermined layer (or film) is formed on a surface (exposed surface) of a wafer itself", or may mean "a predetermined layer (or film) is formed on a layer, a film, or the like formed on a wafer, that is, on an outermost surface of the wafer as a stacked body".

Here, the term "substrate" is synonymous with the term "wafer".

(Wafer Charge and Boat Load: S201)

When a plurality of wafers W is put (wafer-charged) in the boat 26, the boat 26 is loaded (boat-loaded) into the process chamber 24 by the boat elevator 52. At this time, the seal cap 46 air-tightly closes (seals) a lower end of the manifold 22 through the O-ring 48. When the lower end of the manifold 22 is air-tightly closed, the valve 34c is opened and supply of a purge gas to the adiabatic region B is started. The purge gas supplied upward from a lower portion of the adiabatic region B purges the adiabatic region B including the heat insulating portion 54 and a periphery of the heat insulating portion 54, and is discharged from the exhaust port 62. By maintaining supply of the purge gas upward from a lower portion of the adiabatic region B and discharging the purge gas from the exhaust port 62 disposed on a lateral side facing the adiabatic region B, it is possible to suppress diffusion of the purge gas supplied to the adiabatic region B into a film formation region. Note that the valve 34c may be opened from a standby state before wafer charging, and supply of the purge gas to the heat insulating portion 54 may be started. In this case, it is possible to prevent particles wrapped from an outside during wafer charging from adhering to the heat insulating portion 54.

(Pressure Regulation and Temperature Adjustment: S202)

The vacuum pump 44 performs vacuum-exhaust (depressurization-exhaust) such that an interior of the process chamber 24 has a predetermined pressure (degree of vacuum). At this time, the pressure in the process chamber 24 is measured by the pressure sensor 40, and the APC valve 42 is feedback-controlled based on the measured pressure information. The vacuum pump 44 maintains a state of being normally operated at least until processing on the wafers W is completed.

An interior of the process chamber 24 is heated by the heater 14 such that the wafers W in the process chamber 24 have a predetermined temperature. At this time, the degree of energization to the heater 14 is feedback-controlled based on temperature information detected by the temperature detecting unit 56 such that the interior of the process chamber 24 has a predetermined temperature distribution. Heating in the process chamber 24 by the heater 14 is continuously performed at least until processing on the wafers W is completed.

Rotation of the boat 26 and the wafers W by the rotation mechanism 58 is started. The boat 26 is rotated by the rotation mechanism 58 through the rotary shaft 60, and the wafers W are thereby rotated. The rotation of the boat 26 and the wafers W by the rotation mechanism 58 is continuously performed at least until processing on the wafers W is completed.

(Film Formation Processing: S301)

When a temperature in the process chamber 24 becomes stable at a preset processing temperature, the following two steps, that is, steps 1 and 2 are sequentially executed.

([Step 1]: S203)

In this step, an HCDS gas is supplied to the wafers W in the process chamber 24.

The valve 34a is opened to cause the HCDS gas to flow into the gas supply pipe 30a. A flow rate of the HCDS gas is adjusted by the MFC 32a. The HCDS gas is supplied to the processing region A in the process chamber 24 through the gas supply hole 28A of the nozzle 28, the gas supply space 24A, and the gas supply slit 36A, and is discharged from the exhaust pipe 38 through the gas exhaust slit 36B and the gas exhaust space 24B. At this time, the HCDS gas is supplied to the wafers W. At this time, the valve 34b is opened simultaneously, and an N₂ gas is caused to flow into the gas supply pipe 30b. A flow rate of the N₂ gas is adjusted by the MFC 32b. The N₂ gas is supplied together with the HCDS gas to the processing region A in the process chamber 24 through the gas supply hole 28A of the nozzle 28, the gas supply space 24A, and the gas supply slit 36A, and is discharged from the exhaust pipe 38 through the gas exhaust slit 36B and the gas exhaust space 24B. By supplying the HCDS gas to the wafers W, a silicon (Si)-containing layer having a thickness of, for example, less than one atomic layer to several atomic layers is formed as a first layer on an outermost surface of each of the wafers W.

After the first layer is formed, the valve 34a is closed and supply of the HCDS gas is stopped. At this time, with the APC valve 42 open, the interior of the process chamber 24 is vacuum-exhausted by the vacuum pump 44, and the HCDS gas which remains in the process chamber 24, is unreacted, or has contributed to formation of the first layer is discharged from the interior of the process chamber 24. At this time, the supply of the N₂ gas into the process chamber 24 is maintained with the valve 34b open. The N₂ gas acts as a purge gas, and an effect of discharging the gas remaining in the process chamber 24 from the interior of the process chamber 24 can be thereby enhanced.

At this time, the gas remaining in the process chamber 24 does not have to be completely discharged, and the interior of the process chamber 24 does not have to be completely purged. If the amount of the gas remaining in the process chamber 24 is very small, there is no adverse effect in subsequent step 2. A flow rate of a N₂ gas supplied into the process chamber 24 needs not to be high. For example, by supplying the N₂ gas in an amount approximately equal to the volume of the reaction tube 18 (process chamber 24), purging can be performed to such an extent that there is no adverse effect in step 2. In this manner, by not perfectly purging the interior of the process chamber 24, purge time can be shortened and throughput can be improved. It is also possible to minimize consumption of a $N_2$ gas.

([Step 2]: S204)

After step 1 is completed, an $NH_3$ gas is supplied to the wafers W in the process chamber 24, that is, to the first layer formed on each of the wafers W. The $NH_3$ gas is activated by heat and supplied to the wafers W.

In this step, opening/closing control of the valves 34a and 34b is performed in a similar procedure to the opening/closing control of the valves 34a and 34b in step 1. A flow rate of the $NH_3$ gas is adjusted by the MFC 32a. The $NH_3$ gas is supplied to the processing region A in the process chamber 24 through the gas supply hole 28A of the nozzle 28, the gas supply space 24A, and the gas supply slit 36A, and is discharged from the exhaust pipe 38 through the gas exhaust slit 36B and the gas exhaust space 24B. At this time, the $NH_3$ gas is supplied to the wafers W. The $NH_3$ gas supplied to the wafers W reacts with the first layer formed on each of the wafers W in step 1, that is, with at least a part of the Si-containing layer. The first layer is thereby thermally nitrided with non-plasma and is changed (modified) to a second layer containing Si and N, that is, to a silicon nitride layer (SiN layer). Incidentally, at this time, by supplying a plasma-excited $NH_3$ gas to the wafers W to plasma-nitride the first layer, the first layer may be changed to the second layer (SiN layer).

After the second layer is formed, the valve 34a is closed and supply of the $NH_3$ gas is stopped. At this time, with the APC valve 42 open, the interior of the process chamber 24 is vacuum-exhausted by the vacuum pump 44, and the $NH_3$ gas which remains in the process chamber 24, is unreacted, or has contributed to formation of the second layer is discharged from the interior of the process chamber 24. At this time, supply of the $N_2$ gas into the process chamber 24 is maintained with the valve 34b open. The $N_2$ gas acts as a purge gas, and an effect of discharging the gas remaining in the process chamber 24 from the interior of the process chamber 24 can be thereby enhanced. At this time, similarly to step 1, the gas or the like remaining in the process chamber 24 does not have to be completely discharged.

(Performance of a Predetermined Number of Times: S205)

By performing a predetermined number of times (n times) of cycles of non-simultaneously, that is, non-synchronously, performing the above-described two steps, an SiN film having a predetermined composition and a predetermined film thickness can be formed on each of the wafers W. Note that the above-described cycle is preferably performed a plurality of times. That is, preferably, the thickness of the second layer (SiN layer) formed during performance of the above-described one cycle is smaller than the predetermined film thickness, and a plurality of times of the above-described cycles is performed repeatedly until the film thickness of the SiN film formed by stacking the second layer (SiN layer) becomes the predetermined film thickness.

As processing conditions for film formation processing, for example, a processing temperature (wafer temperature): 250 to 700° C., a processing pressure (pressure in a process chamber): 1 to 4000 Pa, an HCDS gas supply flow rate: 100 to 200 sccm, $NH_3$ gas supply flow rate: 1000 to 20000 sccm, a $N_2$ gas (purge gas for purging the adiabatic region B) supply flow rate: 0 to 500 sccm, and a $N_2$ gas (purge gas for purging the processing region A) supply flow rate: 0 to 1000 sccm are exemplified. By setting each of the processing conditions to a certain value within each range, it is possible to appropriately proceed film formation processing. The supply flow rate of the purge gas for purging the adiabatic region B is preferably set to be equal to or lower than the supply flow rate of the process gas.

(Purge and Return to Atmospheric Pressure: S206)

After completion of the film formation processing, the valve 34b is opened, the $N_2$ gas is supplied from the gas supply pipe 30b to the processing region A in the process chamber 24, and the $N_2$ gas is discharged from the exhaust pipe 38 through the gas exhaust slit 36B. The gas remaining in the chamber 24 and a reaction by-product are removed from the interior of the process chamber 24 (purge). Thereafter, an atmosphere in the process chamber 24 is replaced with an inert gas (inert gas replacement), and the pressure in the process chamber 24 is returned to a normal pressure (return to atmospheric pressure).

(Boat Unload and Wafer Discharge: S207)

The seal cap 46 is lowered by the boat elevator 52 and a lower end of the manifold 22 is opened. Then, the processed wafers W are unload out of the reaction tube 18 from a lower end of the manifold 22 while being supported by the boat 26 (boat unload). The processed wafers W are taken out of the boat 26 (wafer discharge).

Next, a second embodiment will be described. The second embodiment is different from the above-described embodiment in that a third exhaust portion (third exhaust port) for discharging an atmosphere of a adiabatic region B is further disposed in a flange portion 18C at a lower end of a reaction tube 18. Hereinafter, elements substantially the same as those described in FIG. 1 are denoted by the same reference numerals, and description thereof is omitted.

Figure 3:
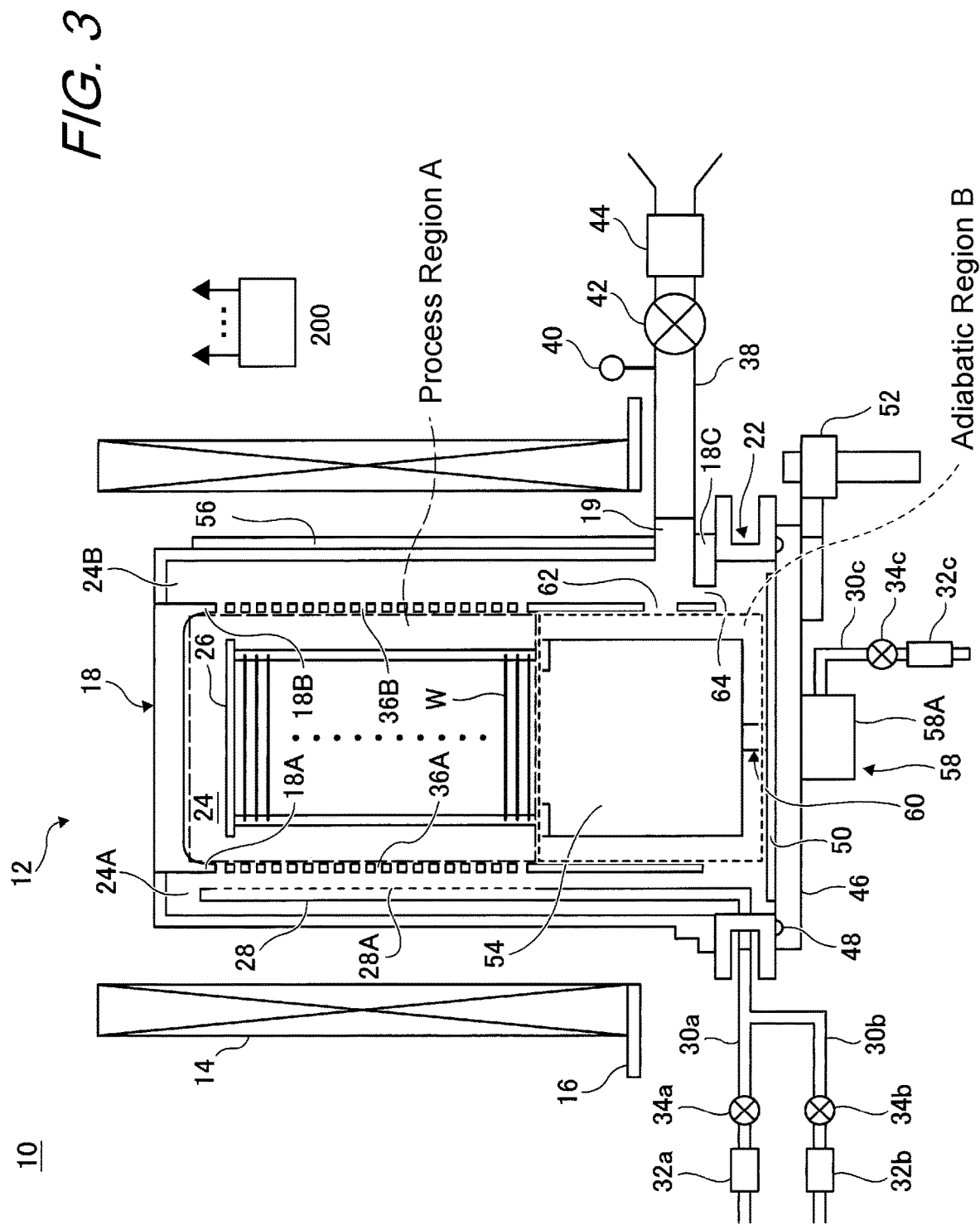
FIG. 3 is a schematic configuration diagram of a vertical processing furnace of a substrate processing apparatus suitably used in a second embodiment, and illustrates a vertical cross-sectional view of a processing furnace portion.

As illustrated in FIG. 3, an exhaust port 64 as a third exhaust portion (third exhaust port) is formed in the flange portion 18C of the reaction tube 18 below an exhaust port 62. The exhaust port 64 is formed such that a lower portion of a process chamber 24 communicates with a gas exhaust space 24B. A purge gas supplied from a gas supply pipe 30c is discharged from the exhaust port 62 and the exhaust port 64 to discharge the atmosphere of the adiabatic region B. That is, it is possible to suppress diffusion of the purge gas supplied to a periphery of a heat insulating portion 54 into a film formation region, and it is possible to suppress deterioration of film formation uniformity due to dilution of a process gas in the film formation region. In addition, it is possible to directly exhaust particularly a periphery of a furnace port portion which is a region around the manifold 22 in the adiabatic region B. Therefore, generation of retention or stagnation of the purge gas in the region can be prevented.

The opening area of the exhaust port 64 is preferably smaller than that of the exhaust port 62. The width of the exhaust port 64 is preferably narrower than that of the exhaust port 62. With such a configuration, the exhaust amount of the exhaust port 62 can be larger than that of the exhaust port 64. It is possible to prevent a large amount of purge gas from being discharged from the exhaust port 64 before the purge gas reaches the heat insulating portion 54 and a periphery of the heat insulating portion 54, and to appropriately purge the heat insulating portion 54.

Next, a third embodiment will be described. In the third embodiment, a configuration of a heat insulating portion is different from that in the above-described first embodiment, and a heat insulating portion 66 divided into upper and lower parts is used.

Figure 4:
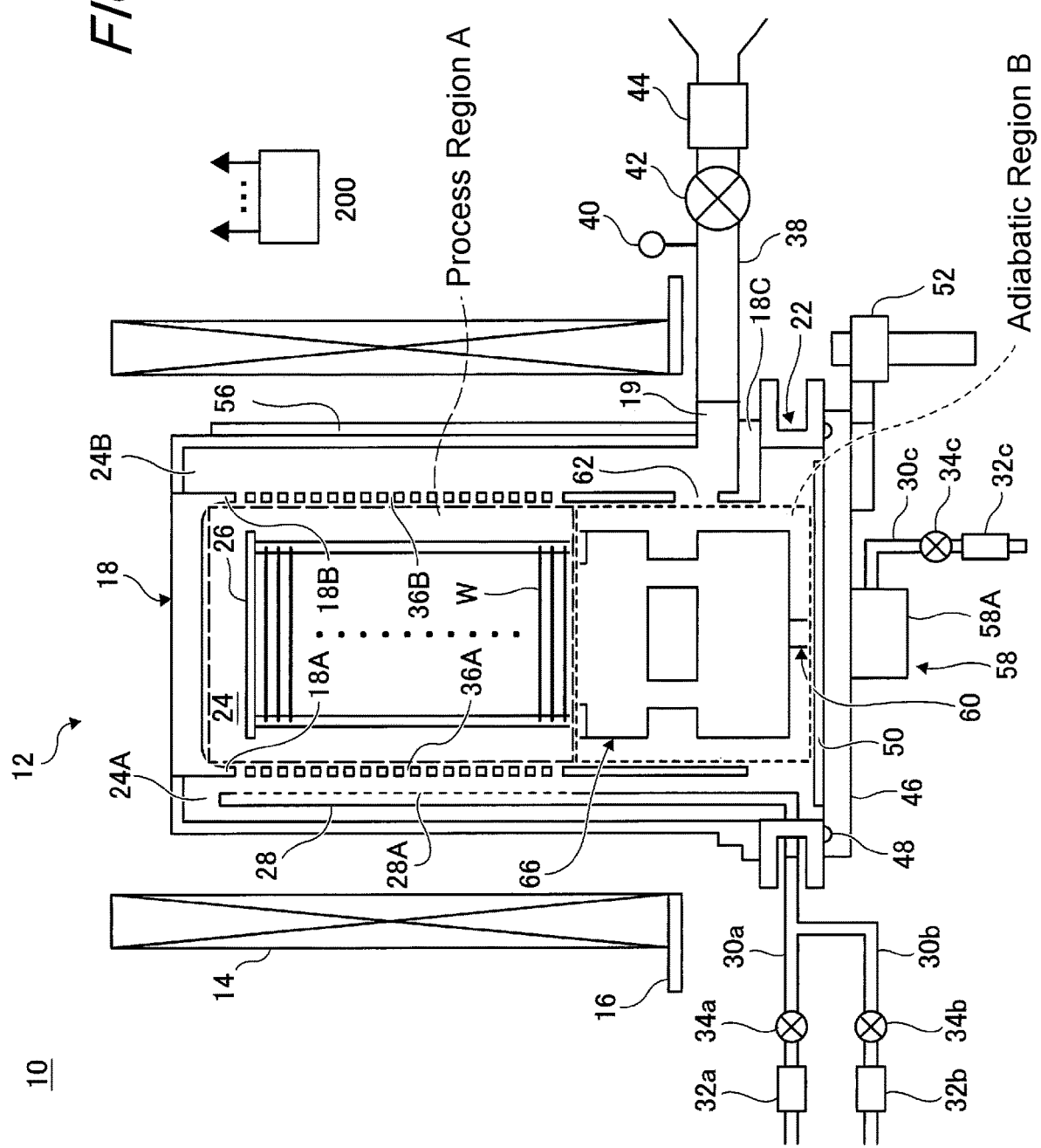
FIG. 4 is a schematic configuration diagram of a vertical processing furnace of a substrate processing apparatus suitably used in a third embodiment, and illustrates a vertical cross-sectional view of a processing furnace portion.
Figure 5:
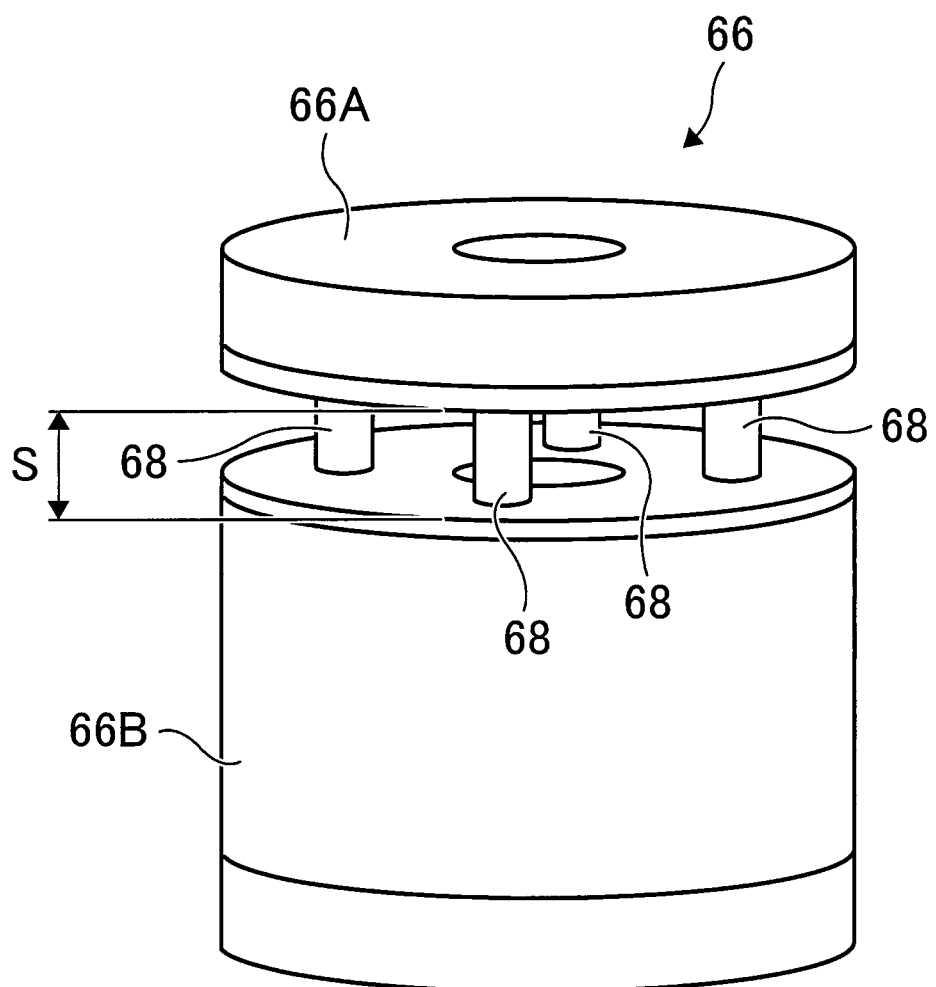
FIG. 5 is a perspective view of a heat insulating portion of the vertical processing furnace of the substrate processing apparatus suitably used in the third embodiment.

As illustrated in FIGS. 4 and 5, the heat insulating portion 66 is divided into a cylindrical upper heat insulator 66A and a cylindrical lower heat insulator 66B. For example, four cylindrical support portions 68 are disposed at equal intervals on a periphery of an upper surface of the lower heat insulator 66B, and the upper heat insulator 66A is supported by the support portions 68 at a predetermined interval S from the lower heat insulator 66B.

An exhaust port 62 is formed at a position where a part of a height position overlaps with the interval S between the upper heat insulator 66A and the lower heat insulator 66B. As a result, a purge gas supplied to a periphery of the heat insulating portion 66 is discharged to the exhaust port 62 through the interval S between the upper heat insulator 66A and the lower heat insulator 66B. That is, a purge gas flowing through a narrow gap between the heat insulating portion 66 and an inner face of the reaction tube 38 on the opposite side of the exhaust port 62 is hardly discharged because there is no exhaust port 62 in the vicinity thereof, and may be easily diffused into a processing region A. However, by forming the interval S, the purge gas flows toward the interval S, and therefore the purge gas can be more efficiently discharged without reaching the processing region A. The exhaust port 62 is preferably formed at a position where at least a part of an opening of the exhaust port 62 overlaps with at least a part of the interval S in a height direction. With such a configuration, a purge gas passing through the interval S can be discharged linearly from the exhaust port 62, and a flow of a discharged gas can be formed without stagnation.

Figure 7:
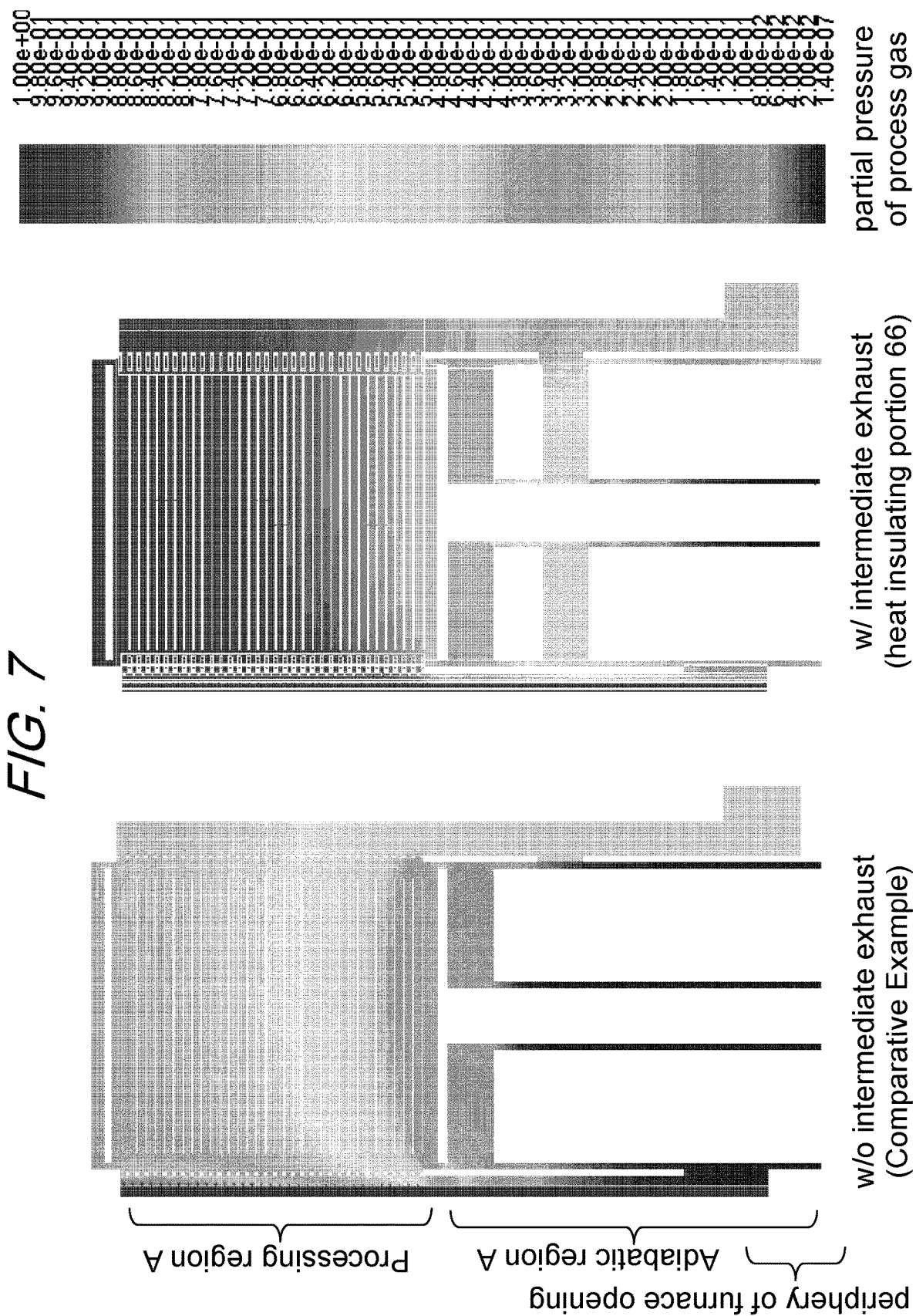
FIG. 7 is an explanatory diagram illustrating a partial pressure (molar fraction) of a process gas in each of the vertical processing furnace of the substrate processing apparatus according to the third embodiment and a furnace in Comparative Example.

FIG. 7 illustrates a partial pressure of a process gas in the processing region A and a adiabatic region B in each of the reaction tube 18 using the exhaust port 62 and the heat insulating portion 66 having an intermediate exhaust (structure having the interval S) according to the third embodiment and the reaction tube 18 using the exhaust port 62 and a heat insulating portion having no intermediate exhaust according to Comparative Example. The partial pressure (amount of gas molecules per unit volume) normalized with respective maximums is shown. As illustrated in FIG. 7, in the processing region A in the reaction tube 18 of Comparative Example, a purge gas which has purged the heat insulating portion is diffusing into the processing region A and the process gas is diluted. The partial pressure of the process gas gets smaller particularly around a furnace opening (fringe) of the reaction tube 18 in the adiabatic region B. Meanwhile, in the heat insulating portion 66 having an intermediate exhaust, the purge gas which has passed through the interval S of the heat insulating portion 66 is discharged from the exhaust port 62. Therefore, diffusion of the purge gas into the processing region A is suppressed and the processing region A has almost the same partial pressure in the entire region. That is, by dividing the heat insulating portion 66, disposing the interval S, and discharging the purge gas from the exhaust port 62 through the interval S, diffusion of the purge gas which has passed through the adiabatic region B into the processing region A is suppressed, and deterioration of film formation uniformity due to dilution of a process gas in the processing region A is suppressed.

Incidentally, in the third embodiment, the configuration using the cylindrical upper heat insulator 66A and the cylindrical lower heat insulator 66B has been described. However, the present teachings are not limited thereto, and may have a configuration in which the heat insulator has a plurality of heat insulating plates stacked with the interval S having a height position partially overlapping with the exhaust port 62 between the stacked heat insulating plates. Furthermore, the present teachings are also applied to a configuration in which not only the exhaust port 62 but also the exhaust port 64 which is a third exhaust portion (third exhaust port) described in detail in the second embodiment is further disposed.

Next, a fourth embodiment will be described. In the fourth embodiment, configurations of a heat insulating portion and a rotary shaft are different from those in the above-described second embodiment, and a purge gas supply portion is disposed in a rotary shaft 72.

Figure 8:
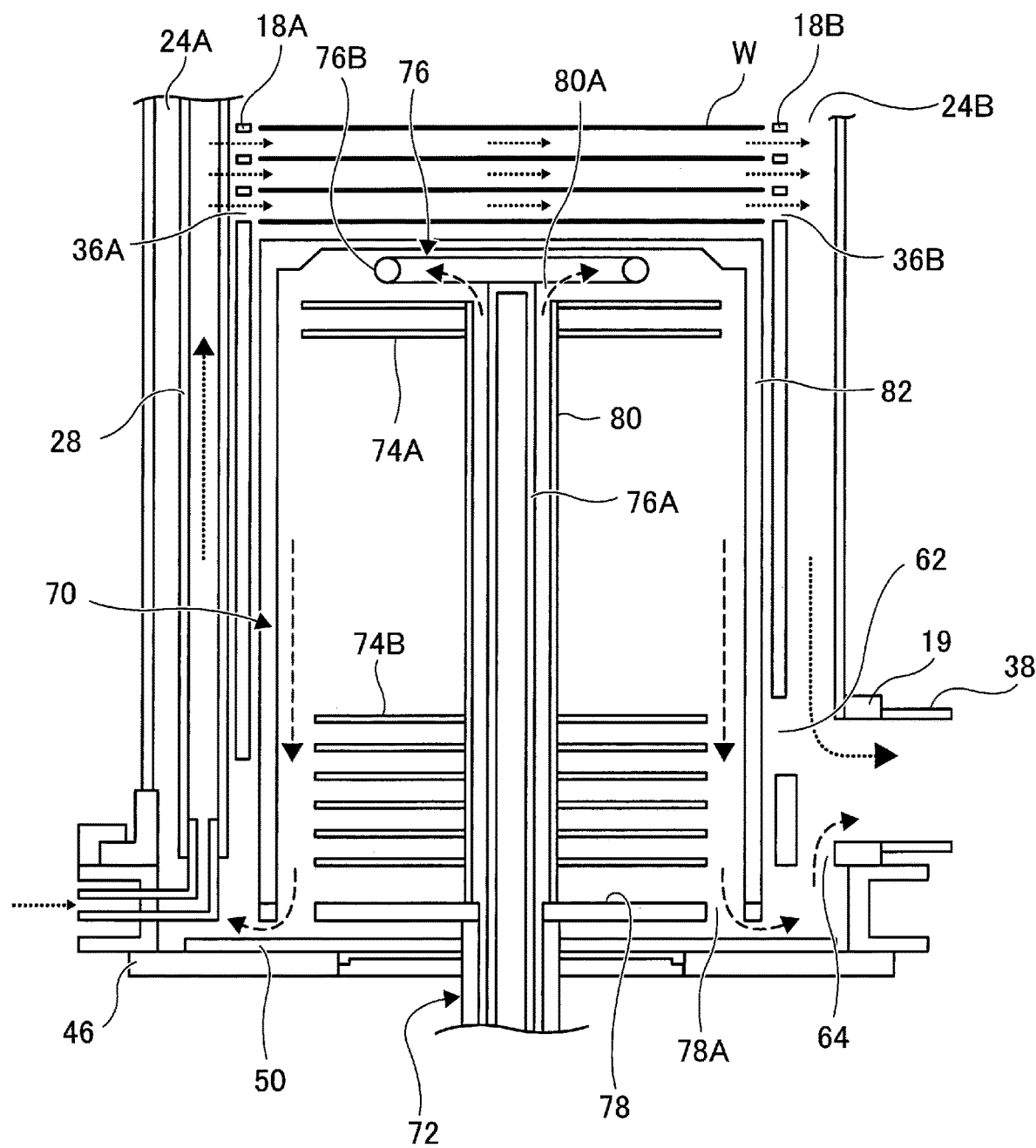
FIG. 8 is a vertical cross-sectional view of a periphery of a heat insulating portion of a vertical processing furnace of a substrate processing apparatus suitably used in a fourth embodiment.
Figure 9:
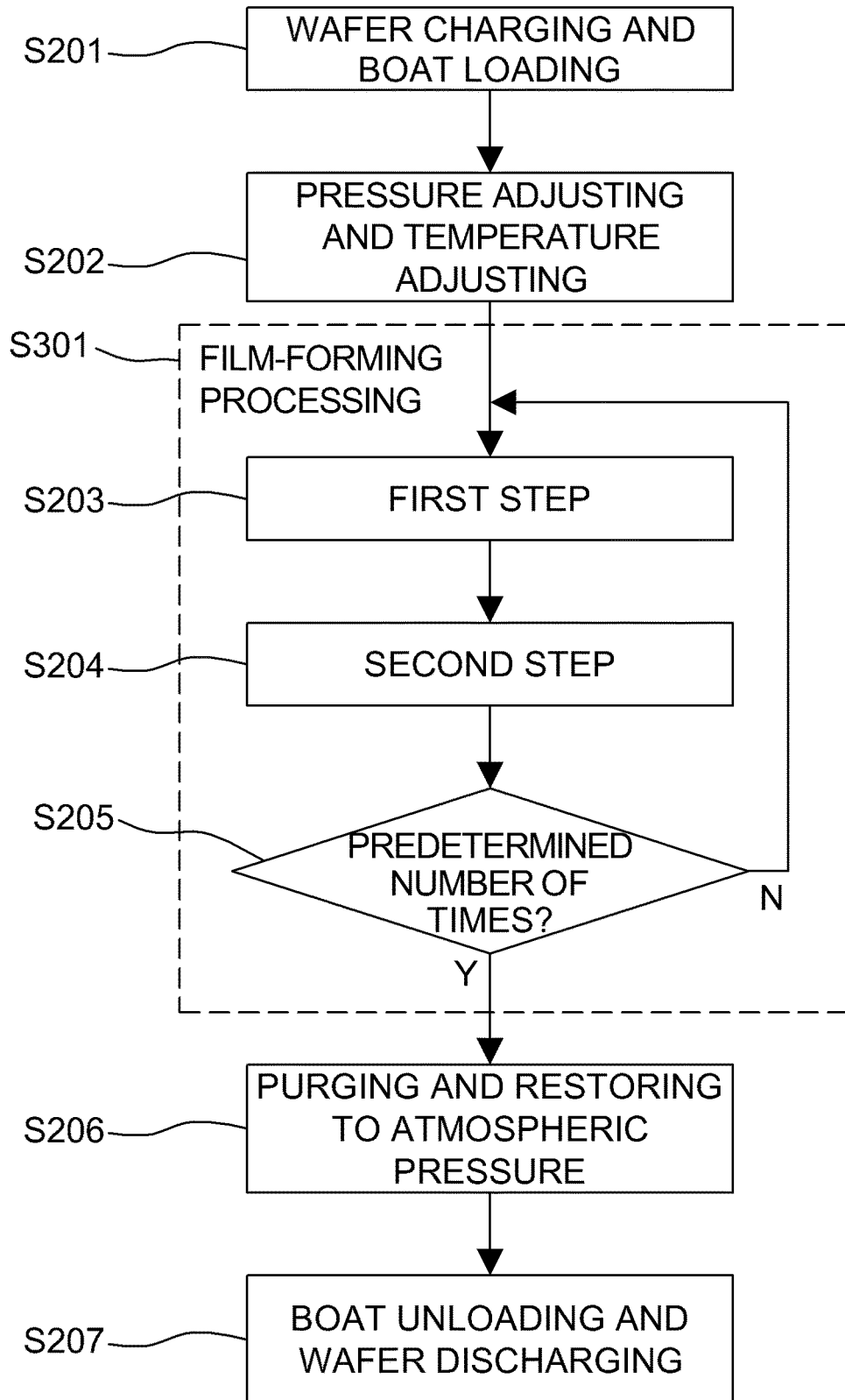
FIG. 9 is an exemplary flowchart illustrating a method of manufacturing a semiconductor device according to the embodiments.

As illustrated in FIG. 8, a heat insulating portion 70 includes a disc-shaped receiving portion 78, a retainer 80 holding a stacked heat insulator 74, and a cylindrical portion 82 covering the stacked heat insulator 74. The retainer 80 and the cylindrical portion 82 are fixed to an upper surface of the receiving portion 78.

The receiving portion 78 is formed of a metal such as stainless steel, for example. A through-hole is formed at a center of the receiving portion 78. Exhaust holes 78A for exhausting an interior of the cylindrical portion 82 are formed at a predetermined interval in the receiving portion 78. For example, the plurality of exhaust holes 78A is formed at equal intervals along concentric circles of the receiving portion 78.

The retainer 80 has a cylindrical shape and has a through-hole with upper and lower ends thereof open. A sub-heater 76 which is a heater unit (hereinafter, referred to as a sub-heater) as a second heating means (heating mechanism) is vertically inserted into the through-hole of the retainer 80. The sub-heater 76 includes a support portion 76A vertically extending and a heat generating portion 76B horizontally connected to the support portion 76A. The heat generating portion 76B is disposed in a region between an upper end of the support portion 76A and an inner wall of the cylindrical portion 82. As a result, it is possible to suppress escape of radiant heat of the sub-heater 76 to an outside of a processing region A, and to shorten heatup time. The heat generating portion 76B is formed in a substantially annular shape having a diameter smaller than an outer diameter of each of wafers W, and is connected to and supported by the support portion 76A so as to be parallel to the wafers W. A heater element wire, which is a coil-shaped heat generator and a resistance heat generating wire, is enclosed in the heat generating portion 76B. The sub-heater 76 is disposed between a boat 26 and the heat insulator 74, and heats the wafers W (processing region A) from below.

In the retainer 80, a reflection plate 74A and a heat insulating plate 74B are disposed as the heat insulator 74. The reflection plate 74A is fixedly held by an upper portion of the retainer 80, for example, by being welded. The heat insulating plate 74B is fixedly held by an intermediate portion of the retainer 80, for example, by being welded.

The reflection plate 74A has a disc shape with a diameter smaller than the diameter of each of the wafers W, and is formed of, for example, opaque quartz. The heat insulating plate 74B has a disc shape having an outer diameter smaller than the outer diameter of each of the wafers W, and is formed of a material having a small heat capacity, for example, quartz, silicon (Si), or SiC.

A through-hole is formed in the rotary shaft 72, and the support portion 76A of the sub-heater 76 is inserted into the through-hole. The receiving portion 78 is fixed to an upper end portion of the rotary shaft 72.

That is, the support portion 76A of the sub-heater 76 is inserted into the through-holes of the rotary shaft 72, the receiving portion 78, and the retainer 80.

The inner diameters of the through-holes of the rotary shaft 72, the receiving portion 78, and the retainer 80 are larger than the outer diameter of the support portion 76A of the sub-heater 76. An annular space is formed between inner walls of the rotary shaft 72, the receiving portion 78, and the retainer 80, and an outer wall of the support portion 76A. A first flow path as a purge gas supply path for supplying a purge gas is formed in the annular space (a periphery of the support portion 76A) between the inner walls of the rotary shaft 72, the receiving portion 78, and the retainer 80, and the outer wall of the support portion 76A.

A gas supply pipe 30c is connected to this annular space. In the gas supply pipe 30c, an MFC 32c and a valve 34c are disposed in order from an upstream side. An upper end of the retainer 80 is configured as a supply port 80A. The supply port 80A is an annular opening, and a purge gas is supplied from the supply port 80A toward an inner upper side of the cylindrical portion 82. By making the supply port 80A an annular opening, it is possible to uniformly supply a purge gas to an upper end of the cylindrical portion 82 and over an entire circumferential direction in an annular planar radial direction.

The cylindrical portion 82 is formed in a cylindrical shape with an upper end closed so as to house the sub-heater 76 therein.

An upper end in the cylindrical portion 82 is formed in a protruded shape. With such a configuration, the thickness of a ceiling portion of the cylindrical portion 82 can be reduced, and a heating efficiency in a lower portion of the processing region A by the sub-heater 76 can be improved. In addition, it is possible to improve a flow of a gas in the cylindrical portion 82, and to prevent the gas from staying in the protruded portion. Furthermore, the purge gas supplied from the supply port 80A strikes an inner wall on an upper surface of the cylindrical portion 82 and flows in a circumferential direction. Thereafter, the purge gas flows downward from an upper side along a side wall in the cylindrical portion 82. Therefore, a down flow of the purge gas is easily formed in the cylindrical portion 82. That is, a down flow can be formed in a second flow path.

In this way, by positively purging particularly the vicinity of an upper end portion (ceiling portion) where the heat generating portion 76B of the sub-heater 76 is disposed in the cylindrical portion 82 with a purge gas, a process gas can be prevented from coming into contact with the heat generating portion 76B. The purge gas supplied from the supply port 80A is discharged from the exhaust hole 78A and the exhaust port 64 through the second flow path which is a space between the retainer 80 and an inner wall of the cylindrical portion 82, and discharges an atmosphere in the heat insulating portion 70. As a result, diffusion of the purge gas which has passed through the heat insulating portion 70 into the processing region A is suppressed, and deterioration of film formation uniformity due to dilution of a process gas in the processing region A is suppressed.

In the above description, the cylindrical portion 82 is included in the heat insulating portion 70 for convenience. However, a region of the sub-heater 76 or lower, that is, a region of the heat insulator 74 mainly insulates heat. Therefore, the region of the heat insulator 74 may be referred to as a heat insulating portion. In this case, it can be considered that the sub-heater 76 is disposed between the boat 26 and the heat insulating portion.

The embodiments have been specifically described above. However, the present teachings are not limited to the above-described embodiments, and various modifications can be made within a range not departing from the gist thereof.

For example, in the above-described embodiments, an example using an HCDS gas as a source gas has been described. However, the present teaching are not limited to such an aspect. In addition to the HCDS gas, for example, it is possible to use, as the source gas, an inorganic halosilane source gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, that is, silicon tetrachloride ($SiCl_4$, abbreviation: STC) gas, or an octachlorotrisilane ($Si_3Cl_8$, abbreviation: OCTS) gas, and an amino-based (amine-based) silane source gas containing no halogen group, such as a trisdimethyl aminosilane ($Si[N(CH_3)_2]_3H$, abbreviation: 3DMAS) gas, a tetrakisdimethyl aminosilane ($Si[N(CH_3)_2]_4$, abbreviation: 4DMAS) gas, a bisdiethyl aminosilane ($Si[N(C_2H_5)_2]_2H_2$, abbreviation: BDEAS) gas, or a bistertiarybutyl aminosilane ($SiH_2[NH(C_4H_9)]_2$, abbreviation: BTBAS) gas. In addition, it is possible to use, as the source gas, an inorganic silane source gas containing no halogen group, such as a monosilane ($SiH_4$, abbreviation: MS) gas, a disilane ($Si_2H_6$, abbreviation: DS) gas, or a trisilane ($Si_3H_8$, abbreviation: TS) gas.

For example, in the above-described embodiments, an example in which an $NH_3$ gas is used as a reaction gas has been described. However, the present teachings are not limited to such an aspect. In addition to the $NH_3$ gas, for example, it is possible to use, as the reaction gas, a hydrogen nitride-based gas such as a diazene ($N_2H_2$) gas, a hydrazine ($N_2H_4$) gas, or a $N_3H_8$ gas, or a gas containing these compounds. In addition, it is possible to use, as the reaction gas, an ethylamine-based gas such as a triethylamine (($C_2H_5)_3N$, abbreviation: TEA) gas, a diethylamine (($C_2H_5)_2NH$, abbreviation: DEA) gas, or a monoethylamine ($C_2H_5NH_2$, abbreviation: MEA) gas, a methylamine-based gas such as a trimethylamine (($CH_3)_3N$, abbreviation: TMA) gas, a dimethylamine (($CH_3)_2NH$, abbreviation: DMA) gas, or a monomethylamine ($CH_3NH_2$, abbreviation: MMA) gas, or the like. Furthermore, it is possible to use, as the reaction gas, an organic hydrazine-based gas such as a trimethylhydrazine (($CH_3)_2N_2(CH_3)H$, abbreviation: TMH) gas, or the like.

In the above-described embodiments, for example, an example in which an SiN film is formed using an HCDS gas as a source gas and a nitrogen (N)-containing gas (nitriding gas) such as a $NH_3$ gas as a reaction gas has been described. However, the present teachings are not limited to such an aspect. For example, separately from these gases or in addition to these gases, an oxygen (O)-containing gas (oxidizing gas) such as an oxygen ($O_2$) gas, a carbon (C)-containing gas such as a propylene ($C_3H_6$) gas, or a boron (B)-containing gas such as a boron trichloride ($BCl_3$) gas is used, and an SiO film, an SiON film, an SiOCN film, an SiOC film, an SiCN film, an SiBN film, or an SiBCN film can be formed, for example, by a film formation sequence described below. Note that the order of causing each gas to flow can be changed appropriately. Also in a case where these films are formed, film formation can be performed under similar processing conditions to those in the above-described embodiments, and effects similar to those in the above-described embodiments can be obtained.

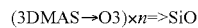

(3DMAS→O3)×n=>SiO

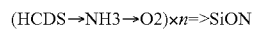

(HCDS→NH3→O2)×n=>SiON

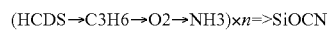

(HCDS→C3H6→O2→NH3)×n=>SiOCN

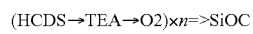

(HCDS→TEA→O2)×n=>SiOC

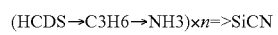

(HCDS→C3H6→NH3)×n=>SiCN (HCDS→BCl3→NH3)×n=>SiBN (HCDS→C3H6→BCl3→NH3)×n=>SiBCN

For example, in the above-described embodiments, an example in which a silicon-based insulating film such as an SiN film is formed has been described. However, the present teachings are not limited to such an aspect. For example, the present teachings can be suitably applied even to a case of forming a film containing a metal element such as titanium (Ti), zirconium (Zr), hafnium (Hf), tantalum (Ta), niobium (Nb), aluminum (Al), molybdenum (Mo), or tungsten (W), that is, a metal-based film on each of the wafers W.

For example, the present teachings can be suitably applied even to a case of forming a TiN film, a TiO film, a TiON film, a TiOCN film, a TiOC film, a TiCN film, a TiBN film, a TiBCN film, a ZrN film, a ZrO film, a ZrON film, a ZrOCN film, a ZrOC film, a ZrCN film, a ZrBN film, a ZrBCN film, an HfN film, an HfO film, an HfON film, an HfOCN film, an HfOC film, an HfCN film, an HfBN film, an HfBCN film, a TaN film, a TaO film, a TaON film, a TaOCN film, a TaOC film, a TaCN film, a TaBN film, a TaBCN film, an NbN film, an NbO film, an NbON film, an NbOCN film, an NbOC film, an NbCN film, an NbBN film, an NbBCN film, an AlN film, an AlO film, an AlON film, an AlOCN film, an AlOC film, an AlCN film, an AlBN film, an AlBCN film, an MoN film, an MoO film, an MoON film, an MoOCN film, an MoOC film, an MoCN film, an MoBN film, an MoBCN film, a WN film, a WO film, a WON film, a WOCN film, a WOC film, a WCN film, a WBN film, or a WBCN film on each of the wafers W. In addition to these films, the present teachings can be also suitably applied to a case of forming a film obtained by doping (adding) another element to any one of these films, for example, a TiAlN film, a TaAlN film, a TiAlC film, a TaAlC film, a TiSiN film, or a TiSiC film.

In a case of forming a metal-based film, for example, it is possible to use, as a source gas, an inorganic metal source gas containing a metal element and a halogen element, such as a titanium tetrachloride ($TiCl_4$) gas, a titanium tetrafluoride ($TiF_4$) gas, a zirconium tetrachloride ($ZrCl_4$) gas, a zirconium tetrafluoride ($ZrF_4$) gas, a hafnium tetrachloride ($HfCl_4$) gas, a hafnium tetrafluoride ($HfF_4$) gas, a tantalum pentachloride ($TaCl_5$) gas, a tantalum pentafluoride ($TaF_5$) gas, a niobium pentachloride ($NbCl_5$) gas, a niobium pentafluoride ($NbF_5$) gas, an aluminum trichloride ($AlCl_3$) gas, an aluminum trifluoride ($AlF_3$) gas, a molybdenum pentachloride ($MoCl_5$) gas, a molybdenum pentafluoride ($MoF_5$) gas, a tungsten hexachloride ($WCl_6$) gas, or a tungsten hexafluoride ($WF_6$) gas. In addition, for example, it is possible to use, as the source gas, an organic metal source gas containing a metal element and carbon, such as a trimethylaluminum ($Al(CH_3)_3$, abbreviation: TMA) gas. As the reaction gas, a similar gas to that in the above-described embodiment can be used.

For example, a TiN film, a TiO film, a TiON film, a TiCN film, a TiAlC film, a TiAlN film, or a TiSiN film can be formed on each of the wafers W by the following film formation sequence.

(TiCl4→NH3)×n=>TiN (TiCl4→O2)×n=>TiO (TiCl4→NH3→O2)×n=>TiON (TiCl4→C3H6→NH3)×n=>TiCN (TiCl4→TMA)×n=>TiAlC (TiCl4→TMA→NH3)×n=>TiAlN (TiCl4→HCDS→NH3)×n=>TiSiN

Note that the order of causing each gas to flow can be changed appropriately. Also in a case where these films are formed, film formation can be performed under similar processing conditions to those in the above-described embodiments, and effects similar to those in the above-described embodiments can be obtained.

That is, the present teachings can be suitably applied to a case of forming a film containing a predetermined element such as a semiconductor element or a metal element.

Furthermore, in the above-described embodiments, an example in which a film is deposited on each of the wafers W has been described. However, the present teachings are not limited to such an aspect. For example, the present teachings can also be suitably applied to a case of performing processing such as oxidizing, diffusion, annealing, or etching on each of the wafers W or a film formed on each of the wafers W.

The embodiments of the present teachings have been specifically described above. However, the present teachings are not limited to the above-described embodiments, and various modifications can be made within a range not departing from the gist thereof.

What is claimed is:

1. A substrate processing apparatus comprising:
   a boat configured to hold a plurality of substrates while the substrates are arranged in a horizontal posture with centers thereof aligned at a predetermined interval in a vertical direction;
   a heat insulating portion disposed below the boat;
   a reaction tube formed in a cylindrical shape with an upper end closed and a lower end open and including a process chamber containing a processing region in which the boat is disposed and a adiabatic region in which the heat insulating portion is disposed;
   a flange formed on a lower end of the reaction tube so as to protrude toward an outer peripheral side;
   a supply buffer chamber protruding outwardly from a side wall of the reaction tube and formed in a vertical direction;
   an exhaust buffer chamber protruding outwardly from a side wall of the reaction tube so as to face the supply buffer chamber and formed in a vertical direction;
   a first exhaust port configured to discharge an atmosphere of the processing region, the first exhaust port being formed in a partition portion serving as a partition between the reaction tube and the exhaust buffer chamber and constituting a part of a side wall of the reaction tube;
   an exhaust port communicating with the exhaust buffer chamber;
   a purge gas supply portion configured to supply a purge gas to the adiabatic region; and
   a second exhaust port configured to discharge an atmosphere of the adiabatic region to the exhaust buffer chamber, the second exhaust port being formed at a position overlapping with the adiabatic region in a height direction in the partition portion.

2. The substrate processing apparatus according to claim 1, wherein the heat insulating portion is formed in a cylindrical shape, and a narrow gap for making the purge gas flow to the processing region exists around the heat insulating portion between the heat insulating portion and an inner wall of the reaction tube.

3. The substrate processing apparatus according to claim 2, further comprising:
   a manifold configured to support the flange, the manifold having an opening at a lower end thereof;
   a furnace lid capable of hermetically closing the opening of the manifold; and
   a rotation mechanism configured to rotate the boat, the rotation mechanism being disposed on the opposite side of the process chamber of the furnace lid,
   wherein the purge gas supply portion is connected to the rotation mechanism, and supplies the purge gas upward from a lower portion of the adiabatic region.

4. The substrate processing apparatus according to claim 3, wherein a third exhaust port configured to cause a lower portion of the process chamber to communicate with the exhaust buffer chamber to discharge an atmosphere of the adiabatic region is disposed in the flange.

5. The substrate processing apparatus according to claim 4, wherein an opening area of the second exhaust port is larger than an opening area of the third exhaust port.

6. The substrate processing apparatus according to claim 3, wherein the second exhaust port is formed at a height position where at least a part of the opening of the second exhaust port overlaps with an opening region of the exhaust port.

7. The substrate processing apparatus according to claim 1, wherein
   the heat insulating portion is divided into a cylindrical upper heat insulator and a cylindrical lower heat insulator, and the upper heat insulator is configured to be supported by a support portion at a predetermined interval from the lower heat insulator, and
   the second exhaust port is formed at a position where at least a part of the opening of the second exhaust port overlaps with a part of the formed predetermined interval in a height direction.

8. The substrate processing apparatus according to claim 1, wherein the first exhaust port includes a plurality of horizontally elongated exhaust slits disposed from a lower portion to an upper portion of the processing region.

9. The substrate processing apparatus according to claim 8, wherein a plurality of horizontally elongated supply slits is formed in a partition portion serving as a partition between the reaction tube and the supply buffer chamber and constituting a part of a side wall of the reaction tube from a lower portion to an upper portion of the processing region.

10. The substrate processing apparatus according to claim 3, further comprising a nozzle configured to supply a plurality of kinds of process gases and an inert gas to the processing region, the nozzle being disposed in the supply buffer chamber, wherein
    a plurality of gas supply holes open so as to face a center of the reaction tube is formed at positions corresponding to the plurality of supply slits on a side surface of the nozzle.

11. The substrate processing apparatus according to claim 3, further comprising:
    on an upper surface of the furnace lid,
    a seal member in contact with a lower end of the manifold; and
    a disc-shaped cap plate configured to protect the furnace lid, the disc-shaped protection plate being disposed in an inner region of the seal member.

12. The substrate processing apparatus according to claim 2, wherein
    the heat insulating portion includes a plurality of plate-shaped heat insulators and a cylindrical portion surrounding the heat insulators,
    a heater configured to heat the processing region is further included between the substrate and the heat insulators, and
    the purge gas supply portion supplies the purge gas into the cylindrical portion.

13. The substrate processing apparatus according to claim 3, wherein the heat insulating portion includes:
    a receiving portion having a disc shape with a through-hole formed at a center thereof, and fixed onto a hollow rotary shaft of the rotation mechanism;
    a heat insulator configured by stacking a plurality of reflection plates and a plurality of heat insulating plates;
    a retainer having a cylindrical shape with upper and lower ends open, disposed on an upper surface of the receiving portion, and holding the heat insulator;
    a cylindrical portion having a cylindrical shape with an upper end closed, disposed on an upper surface of the receiving portion, and covering the heat insulator; and
    a sub-heater including a support portion inserted into the retainer and a heat generating portion horizontally disposed in a space between an upper end of the support portion and an inner wall of the cylindrical portion, and
    a space between an inner surface of the retainer and an outer surface of the support portion configures a supply path of the purge gas.

14. A method for manufacturing a semiconductor device using the substrate processing apparatus according to claim 3, comprising:
    loading the substrates into the processing region; alternately supplying a plurality of process gases to the substrates in the processing region, discharging an atmosphere of the processing region from the first exhaust port, and processing the substrates; and
    supplying the purge gas to the adiabatic region, discharging an atmosphere of the adiabatic region from the second exhaust port, and purging the adiabatic region.

* * * * *